(12) United States Patent
Liu et al.

(10) Patent No.: US 7,172,908 B2
(45) Date of Patent: Feb. 6, 2007

(54) MAGNETIC MEMORY CELLS AND MANUFACTURING METHODS

(75) Inventors: Yuan-Hung Liu, Hsinchu (TW); Chih-Ta Wu, Hsinchu (TW); Lan-Lin Chao, Sindian (TW); Yeur-Luen Tu, Taichung (TW); Wen-Chin Lin, Hsinchu (TW); Chia-Shiung Tsai, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 18 days.

(21) Appl. No.: 10/906,357

(22) Filed: Feb. 15, 2005

(65) Prior Publication Data

US 2006/0183318 A1   Aug. 17, 2006

(51) Int. Cl.
*H01L 21/00* (2006.01)

(52) U.S. Cl. .................. 438/3; 365/66; 438/618; 438/622; 438/631; 438/633; 438/634

(58) Field of Classification Search .................. 438/3, 438/618, 622, 631, 633, 634; 365/66
See application file for complete search history.

(56) References Cited

U.S. PATENT DOCUMENTS

| | | | |
|---|---|---|---|
| 5,856,227 A | 1/1999 | Yu et al. |
| 5,858,838 A | 1/1999 | Wang et al. |
| 5,904,566 A | 5/1999 | Tao et al. |
| 5,925,575 A | 7/1999 | Tao et al. |
| 5,930,644 A | 7/1999 | Tsai et al. |
| 6,015,757 A | 1/2000 | Tsai et al. |
| 6,025,273 A | 2/2000 | Chen et al. |
| 6,040,248 A | 3/2000 | Chen et al. |
| 6,093,619 A | 7/2000 | Huang et al. |
| 6,093,711 A | 7/2000 | de la Harpe et al. |
| 6,194,128 B1 | 2/2001 | Tao et al. |
| 6,211,061 B1 | 4/2001 | Chen et al. |
| 6,218,244 B1 | 4/2001 | Chan et al. |
| 6,232,175 B1 | 5/2001 | Liu et al. |
| 6,271,084 B1 | 8/2001 | Tu et al. |
| 6,291,312 B1 | 9/2001 | Chan et al. |
| 6,319,821 B1 | 11/2001 | Liu et al. |
| 6,323,121 B1 | 11/2001 | Liu et al. |
| 6,331,480 B1 | 12/2001 | Tsai et al. |
| 6,342,419 B1 | 1/2002 | Tu |
| 6,383,943 B1 | 5/2002 | Chen et al. |
| 6,429,119 B1 | 8/2002 | Chao et al. |
| 6,444,575 B1 | 9/2002 | Yu et al. |
| 6,472,335 B1 | 10/2002 | Tsai et al. |
| 6,492,245 B1 | 12/2002 | Liu et al. |
| 6,501,120 B1 | 12/2002 | Tu et al. |
| 6,528,366 B1 | 3/2003 | Tu et al. |

(Continued)

*Primary Examiner*—Zandra V. Smith
*Assistant Examiner*—Bac H. Au
(74) *Attorney, Agent, or Firm*—Baker & McKenzie LLP

(57) ABSTRACT

An improved magnetoresistive memory device has a reduced distance between the magnetic memory element and a conductive memory line used for writing to the magnetic memory element. The reduced distance is facilitated by forming the improved magnetoresistive memory device according to a method that includes forming a mask over the magnetoresistive memory element and forming an insulating layer over the mask layer, then removing portions of the insulating layer using a planarization process. A conductive via can then be formed in the mask layer, for example using a damascene process. The conductive memory line can then be formed over the mask layer and conductive via.

14 Claims, 6 Drawing Sheets

U.S. PATENT DOCUMENTS

| | | |
|---|---|---|
| 6,555,442 B1 | 4/2003 | Pai et al. |
| 6,624,018 B1 | 9/2003 | Yu et al. |
| 6,638,853 B1 | 10/2003 | Sue et al. |
| 6,656,847 B1 | 12/2003 | Lin et al. |
| 6,713,802 B1 | 3/2004 | Lee |
| 6,734,526 B1 | 5/2004 | Tu et al. |
| 6,753,260 B1 | 6/2004 | Li et al. |
| 6,881,351 B2 * | 4/2005 | Grynkewich et al. ......... 216/22 |
| 7,001,779 B2 * | 2/2006 | Drewes .................. 438/3 |
| 2003/0199104 A1 | 10/2003 | Leuschner et al. |
| 2003/0206434 A1 | 11/2003 | Leuschner |
| 2003/0222298 A1 | 12/2003 | Yu et al. |
| 2004/0021188 A1 * | 2/2004 | Low et al. .................. 257/421 |
| 2004/0174728 A1 | 9/2004 | Takano et al. |
| 2004/0185637 A1 | 9/2004 | Fu et al. |
| 2004/0188730 A1 | 9/2004 | Lin et al. |
| 2004/0188749 A1 | 9/2004 | Chang et al. |
| 2004/0191928 A1 | 9/2004 | Shi |

* cited by examiner

“MAGNETIC MEMORY CELLS AND MANUFACTURING METHODS

TECHNICAL FIELD

This invention relates to semiconductor memory devices, particularly those utilizing a magnetoresistive structure for data storage.

BACKGROUND

Magnetic random access memory (MRAM) is non-volatile memory that uses magnetism rather than electrical power to store data. FIG. 1 shows a schematic diagram of a portion 10 of an MRAM array, which includes a plurality of memory cells 12–19 and a series of conductive lines 40–48. Each memory cell 12–19 includes a magnetoresistive (MR) memory element 20–27 and a transistor 30–37. For this reason, the architecture shown in FIG. 1 is referred to as 1T1MTJ (one transistor, one MTJ) architecture.

As shown in FIG. 1, the transistors 30–33 are coupled to each other via a word line (WL1) 40, and transistors 34–37 are coupled to each other via a word line (WL2) 41, where the word lines 40, 41 form the gate electrode for the transistors 30–37. The transistors 30–33 are also coupled to each other via a program line (PL1) 42, and transistors 34–37 are coupled via a program line (PL2) 43, where the program lines 42, 43 serve as virtual ground lines. Similarly, the MR memory elements 20 and 24 are coupled to each other by bit line (BL1) 45, MR memory elements 21 and 25 are coupled to each other by bit line (BL2) 46, MR memory elements 22 and 26 are coupled to each other by bit line (BL3) 47, and MR memory elements 23 and 27 are coupled to each other by bit line (BL4) 48. The bit lines 45–48 are typically somewhat perpendicular to the word lines 40, 41 and the program lines 42, 43.

The terminology used in the art for the various conductive lines (e.g., bit lines, program lines, and word lines) can vary. For example, the "bit lines" in FIG. 1 are sometime referred to as "word lines" or "upper write lines," and the "program lines" in FIG. 1 are sometimes referred to as "digit lines" or "bottom write lines." For the sake of clarity, the terminology used in connection with FIG. 1 will be used throughout the present document.

Each of the MR memory elements 20–27 can be a multi-layer magnetoresistive structure, such as a magnetic tunneling junction (MTJ) or a giant magnetoresistive (GMR) structure. FIG. 2 shows an example of a typical MTJ structure 50. The MTJ structure 50 includes four basic layers: a free layer 52, a spacer 54 which serves as a tunneling barrier, a pinned layer 56, and a pinning layer 58. The free layer 52 and the pinned layer 56 are constructed of ferromagnetic material, for example cobalt-iron or nickel-cobalt-iron. The pinning layer 58 is constructed of antiferromagnetic material, for example platinum manganese. Magnetostatic coupling between the pinned layer 56 and the pinning layer 58 causes the pinned layer 56 to have a fixed magnetic moment. The free layer 52, on the other hand, has a magnetic moment that, by application of a magnetic field, can be switched between a first orientation, which is parallel to the magnetic moment of the pinned layer 56, and a second orientation, which is antiparallel to the magnetic moment of the pinned layer 56.

The spacer 54 interposes the pinned layer 56 and the free layer 52. The spacer 54 is composed of insulating material, for example aluminum oxide, magnesium oxide, or tantalum oxide. The spacer 54 is formed thin enough to allow the transfer (tunneling) of spin-aligned electrons when the magnetic moments of the free layer 52 and the pinned layer 56 are parallel. On the other hand, when the magnetic moments of the free layer 52 and the pinned layer 56 are antiparallel, the probability of electrons tunneling through the spacer 54 is reduced. This phenomenon is commonly referred to as spin-dependent tunneling (SDT).

As shown in FIG. 3, the electrical resistance through the MTJ 50 (e.g., from layer 52 to layer 58 or vice-versa) increases as the moments of the pinned and free layers become more antiparallel and decreases as they become more parallel. In an MRAM memory cell, the electrical resistance of the MTJ 50 can therefore be switched between first and second resistance values representing first and second logic states. For example, a high resistance value can represent a logic state "1" and a low resistance value can represent a logic state "0." The logic states thus stored in a memory cell can be read by passing a sense current through the MR memory element and sensing the resistance. For example, referring back to FIG. 1, the logic state of memory cell 12 can be read by passing a sense current through bit line (BL1) 45, activating transistor 30 via word line (WL1) 40, and sensing the current passing from (BL1) 45 through the MTJ 20 and on to program line (PL1) 42.

During a write operation, electrical current flows through a program line 42, 43 and a bit line 45–48 that intersect at the target memory cell 12–19. For example, in order to write to memory cell 13, a current is passed through program line (PL1) 42 and a current is passed through bit line (BL2) 46. The magnitude of these currents is selected such that, ideally, the resulting magnetic fields are not strong enough on their own to affect the memory state of the MR memory elements 20–23 and 25, but the combination of the two magnetic fields (at MR memory element 21) is sufficient for switching the memory state (e.g., switching the magnetic moment of the free layer 52) of the MR memory element 21.

A method of fabricating a magnetic memory device is disclosed in U.S. Pat. No. 6,713,802 to Lee. Specifically, this patent discloses the use of a damascene process to create a via connection between a top write line (corresponding to a "bit line" in FIG. 1) and the MTJ. A film (mask 128) is used as an insulating layer in which vias can be formed, and it is also used as a stop layer for a dielectric CMP process. Since this film (mask 128) is used as a stop layer for dielectric CMP, it has a minimum thickness of about 4000 angstroms in order to protect against being etched through itself. But because the top write line is used for generating a magnetic field for writing to the MTJ, it is desirable to have the write line as close to the MTJ as possible. Thus the thickness requirement of the interconnect film (mask 128) competes with the desire to place the write line closer to the MTJ.

SUMMARY

Disclosed herein is an improved magnetoresistive memory device having a reduced distance between the magnetic memory element and a conductive memory line used for writing to the magnetic memory element. By reducing the distance between the memory element and the write line, the write current can be reduced in the write line for write operations, which in turn reduces the risk of cross-talk between neighboring memory cells.

According to the present disclosure, a magnetic memory device, for example an MRAM memory device, can be produced that has a distance between the magnetic memory element and the write line that is less than 1500 angstroms, for example in a range of 300 angstroms to 1500 angstroms.

Such a device can be fabricated according to disclosed methods, which include forming a mask layer over the magnetoresistive memory element and an insulating layer over the mask layer, then removing portions of the insulating layer using a planarization process, for example CMP. Vias can then be formed in the mask layer, for example using a damascene process, and then conductive memory lines can be formed over the mask layer and into the vias in order to effect an electrical connection between the conductive memory lines and the MTJs.

BRIEF DESCRIPTION

Embodiments are illustrated by way of example in the accompanying figures, in which like reference numbers indicate similar parts, and in which.

DETAILED DESCRIPTION

Figure 1:
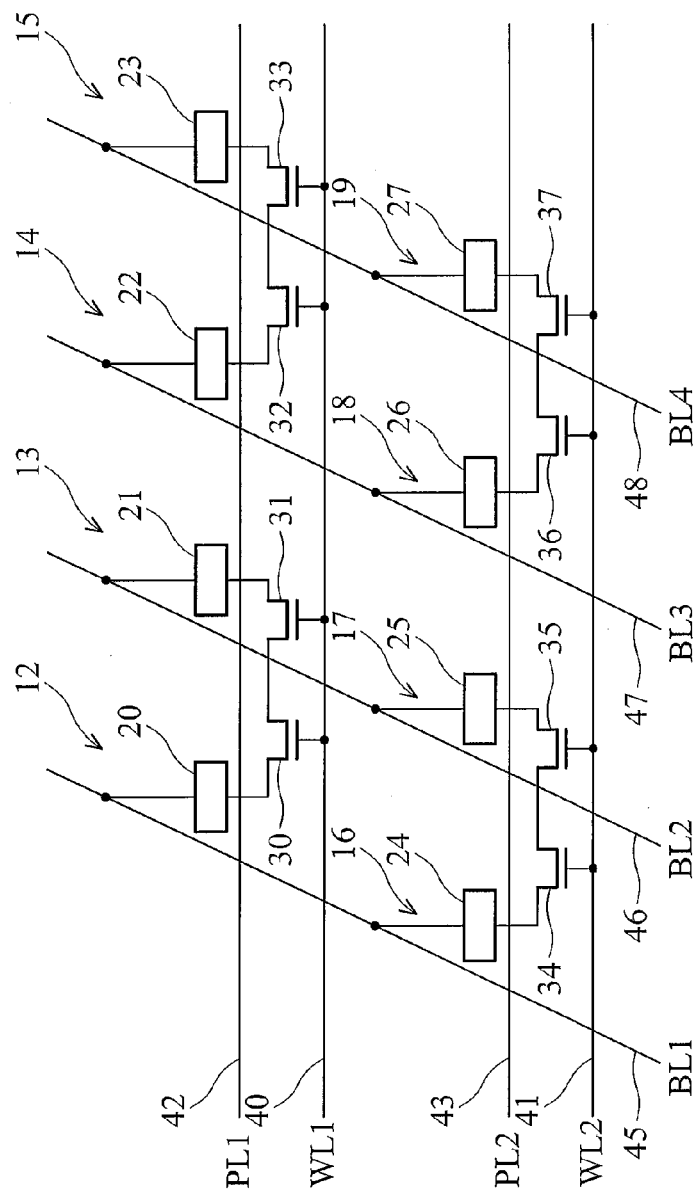
FIG. 1 shows a schematic diagram of a portion of an MRAM array.
Figure 2:
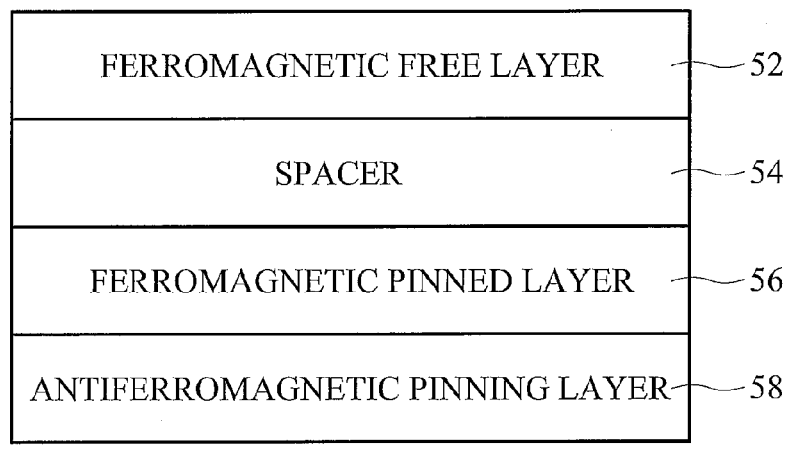
FIG. 2 shows a schematic block diagram of a typical MTJ structure.
Figure 3:
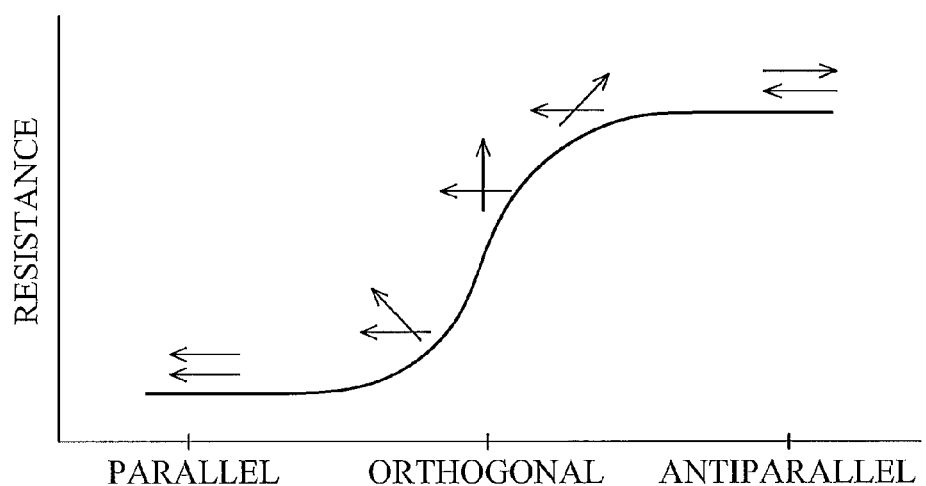
FIG. 3 shows a graph of the relationship between resistance and the relative magnetic orientations of the free and pinned layers in the MTJ shown in FIG. 2.
Figure 4:
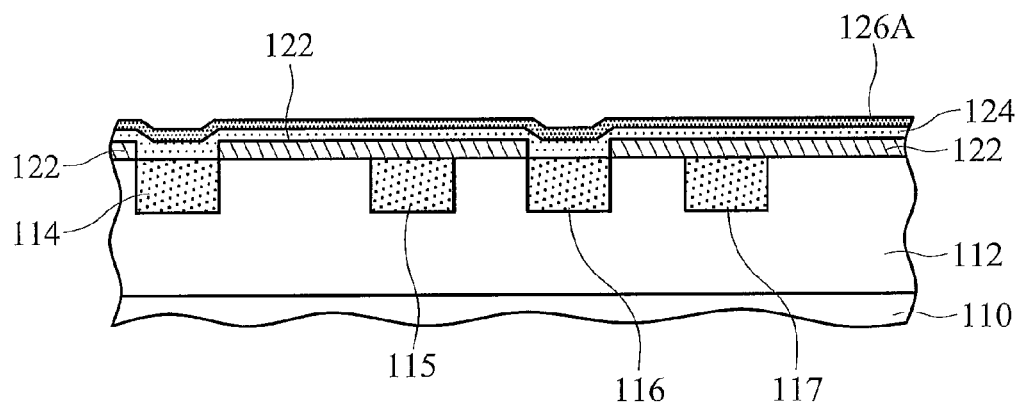
FIGS. 4–10 show a series of schematic cross-sectional views illustrating the results of progressive stages of fabricating a magnetoresistive storage device.

FIG. 4 shows a schematic cross-sectional view of an early stage in the fabrication process. At the stage shown in FIG. 4, the device includes a substrate 110 having a dielectric layer 112 formed thereon, a series of conductive elements 114–117, an insulating layer (spacer) 122, an electrode layer 124, and a magnetoresistive layer 126.

The substrate 110 can be a semiconductor substrate, such as a p-type silicon wafer with <100> crystal surface. The substrate 110 can also include any other suitable semiconductor material, for example GaAs, InP, SiC, or Si/Ge. The substrate 110 can also include active components or circuits formed in the front end of the line (FEOL), not shown.

In one embodiment the substrate 110 is provided as a base for forming the MRAM circuits and the wafer substrate is initially planarized, for example using wet chemical mechanical polishing (CMP). The substrate 110 may be formed then processed to comprise planar circuit elements (not shown) such as MOSFETS or other transistors or circuits using implanted or deposited circuit elements. A dielectric layer 112 is then formed over the substrate 110 including any circuit elements formed in or on the substrate 110. The dielectric layer 112 can be referred to as an inter-level dielectric (ILD) layer, which may be the wafer's first layer that substantially establishes a new planarized surface. In some embodiments, the dielectric layer 112 can include multiple sub-layers (not shown). For example, the dielectric layer 112 can include a first sub-layer formed with silicon oxynitride (SiON), a second sub-layer formed over the first sub-layer with plasma-enhanced oxide (PEOX), and a third sub-layer formed over the second sub-layer with SiON, where the first sub-layer can have a thickness in a range of 1050 Å to 1350 Å, for example 1200 Å, the second sub-layer can have a thickness in a range of 2100 Å to 2900 Å, for example 2500 Å, and the third sub-layer can have a thickness in a range of 1050 Å to 1350 Å, for example 1200 Å. The dielectric layer 112 can also be planarized using a reflow process or spin-on glass deposition.

The dielectric layer 112 is patterned, etched, and filled with a conductive material to form the conductive elements 114–117, e.g., using a damascene process. The pattern and fill process may comprise a single damascene or dual-damascene process, with vias connecting to substrate circuit elements (not shown) being filled at the same time as the conductive elements 114–117. The dielectric layer 112 can be lithographically patterned, for example using photolithography, and reactive ion etched (RIE) to form trenches where the conductive elements 114–117 will be formed. In embodiments where photolithography is used, the dielectric layer 112 can include an upper sub-layer of SiON for use as an antireflective coating (ARC) in order to improve control of the photolithography process.

The conductive elements 114–117 comprise a conductive material, for example Cu, Al, TiN, Ti, W, combinations thereof, or other conductive materials. Depending on the conductive material used, the conductive elements 114–117 can include an optional liner (not shown). For example, if copper is used for the conductive elements 114–117, the optional liner can first be deposited to form a diffusion barrier for confining the copper. In this case, the optional liner can be formed of Ta or TaN or any other material that is a good diffusion barrier for confining copper. Conductive material is deposited over the dielectric layer 112 and within the trenches using any deposition technique suitable for the conductive material selected. For example, in the case of copper, electrodeposition (e.g., electroplating) can be used for deposition. As an alternative, any of a number of known deposition processes can be used, for example chemical vapor deposition (CVD) or physical vapor deposition (PVD). A CMP or other etching process is then used for removing the excessive conductive material from above the top surface of the dielectric layer 112.

After the exposed surfaces of the dielectric layer 112 and the conductive elements 114–117 have been planarized, the insulating layer 122 is deposited over the planarized surface. The insulating layer 122 can be formed to have any thickness suitable for allowing the insulating layer 122 to provide electrical isolation, for example between the conductive elements 115, 117 and an electrode layer 124 discussed below, for example 600 Å. The insulating layer 122 is formed of a dielectric material, for example SiN. As an alternative, the insulating layer 122 can be formed of SiON, SiCN, or SiC. The insulating material can be deposited by any deposition process appropriate for the selected dielectric material. For example, SiN can be deposited using a plasma enhanced chemical vapor deposition (PECVD) process.

The insulating layer 122 is patterned and etched to expose the upper surfaces of the conductive elements 114 and 116. The insulating layer 122 can be lithographically patterned, for example using photolithography, and reactive ion etched (RIE) to form trenches over the upper surfaces of the conductive elements 114 and 116.

The electrode layer 124 is formed over the insulating layer 122 and the exposed surfaces of the conductive elements 114 and 116. The electrode layer 124 is a conductive layer serving as a lower electrode of the magnetoresistive elements formed in steps described below. The electrode layer 124 can be formed of any conductive material, for example the electrode layer 124 can be a layer of tantalum (Ta) formed by CVD to have a thickness greater than 200 Å.

The magnetoresistive layer 126 is formed over the electrode layer 124. In some embodiments, the magnetoresistive layer 126 includes layers for forming a magnetic tunnel junction. In such embodiments, the magnetoresistive layer 126 includes an antiferromagnetic layer formed over the electrode layer 124, a first ferromagnetic layer ("pinned" layer) formed over the antiferromagnetic layer, a tunnel barrier formed over the first ferromagnetic layer, a second ferromagnetic layer ("free" layer) formed over the tunnel barrier, and a capping layer/upper electrode layer formed over the second ferromagnetic layer.

When the MR layer 126 includes layers for forming a magnetic tunnel junction, the ferromagnetic layers can be formed of ferromagnetic materials comprising cobalt (Co), iron (Fe), nickel (Ni), or alloys containing these elements. For example, materials that can be used for the ferromagnetic layers can be a $Co_{90}Fe_{10}$ (at %) alloy, a CoFeNi alloy, or a $Ni_{80}Fe_{20}$ alloy (permalloy). The tunnel barrier can be formed of an insulating material, for example an aluminum oxide (e.g., $AlO_x$) such as $Al_2O_3$ or a nitride such as AlN. The antiferromagnetic layer can be formed of an antiferromagnetic material comprising a manganese (Mn)-based alloy containing, for example, iron (Fe), platinum (Pt), iridium (Ir), rhodium (Rh), ruthenium (Ru), or palladium (Pd). For example, materials that can be used for forming an AFM layer can be an FeMn alloy, a PtMn alloy, a PtPdMn alloy, or an IrMn alloy. The ferromagnetic pinned layer can be a multi-layered structure. The ferromagnetic pinned layer can comprise a synthetic antiferromagnetic (SAF) structure that includes a pair of ferromagnetic layers separated by a layer of Ruthenium (Ru).

Examples of suitable thicknesses for the magnetic tunnel junction layers of the magnetoresistive layer 126 are summarized in Table 1 below. In Table 1, "FM FREE" refers to the ferromagnetic free layer, "FM PINNED" refers to the ferromagnetic pinned layer, "AFM" refers to the antiferromagnetic pinning layer, and "TB" refers to the tunnel barrier. It should be noted that these thicknesses are not intended to be limiting in any way, but instead are provided merely as examples.

TABLE 1

| Layer | Exemplary Thickness Range (Å) | Exemplary Thickness (Å) |
| --- | --- | --- |
| FM FREE | 10–50 | 20 |
| FM PINNED | 10–50 | 20 |
| AFM | 100–500 | 200 |
| TB | 5–20 | 10 |

In the magnetoresistive layer 126 described above comprising a magnetic tunnel junction, the magnetoresistive layer 126 can include as a free/spacer/pinned/pinning series of layers. In such a structure, the magnetization direction of the free layer is free to change under the influence of an applied magnetic field. The magnetization direction of the pinned layer is fixed to a particular direction due to exchange coupling with an antiferromagnetic pinning layer. The antiferromagnetic pinning layer can be initialized during manufacturing to have a particular exchange bias that determines the pinning direction, or the direction in which the magnetization direction of the ferromagnetic pinned layer will be set.

The exchange bias of the antiferromagnetic pinning layer can be set using an initialization process. In order to initialize the exchange bias of the antiferromagnetic pinning layer and pin the ferromagnetic pinned layer, these layers are heated to a blocking temperature (e.g., at or above the Néel temperature of the antiferromagnetic material) and then subsequently cooled to an ambient temperature in the presence of a magnetic field.

During the initialization process, a strong magnetic field, for example a field of 2000 oersteds, is applied in a direction parallel to the desired magnetization direction. The layers are heated in the presence of the applied magnetic field to a blocking temperature, for example to a temperature greater than 200° C. (e.g., 200° C.–300° C.), for any amount of time necessary, for example in a range of 15 minutes to several hours, depending upon the material. The layers are then cooled in the presence of the applied magnetic field to fix the pinned layer magnetization and exchange bias at the desired direction. Magnetic exchange coupling between the antiferromagnetic pinning layer and the ferromagnetic pinned layer will keep the magnetization direction of the ferromagnetic pinned layer fixed.

The magnetoresistive layer 126 includes a capping layer, for example deposited over the magnetic tunnel junction layers. The capping layer comprises approximately 10 nm of a material such as WN, TiN, Ta, or TaN.

Figure 5:
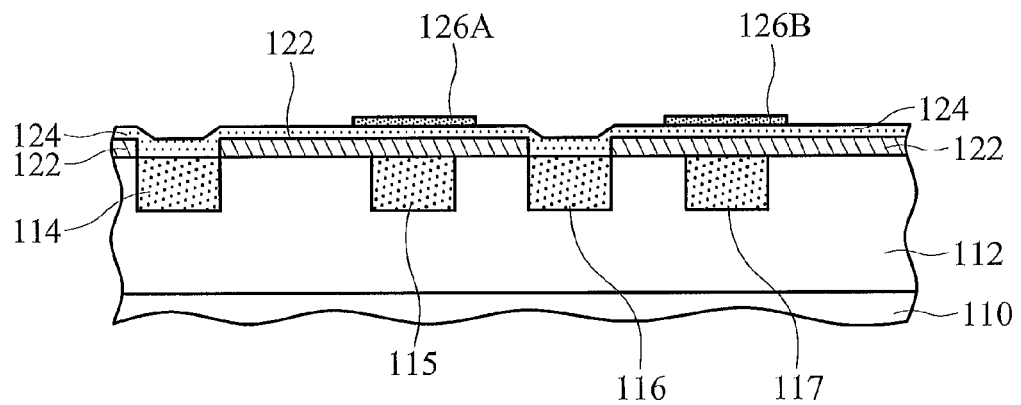

As shown in FIG. 5, the magnetoresistive layer 126 is patterned and etched to expose the upper surface of the electrode layer 124, except in regions over the conductive elements 115 and 117, to form magnetoresistive elements 126A and 126B. The magnetoresistive layer 126 can be lithographically patterned, for example using photolithography, and reactive ion etched (RIE) to stop on the Ta material of the electrode layer 124.

Figure 6:
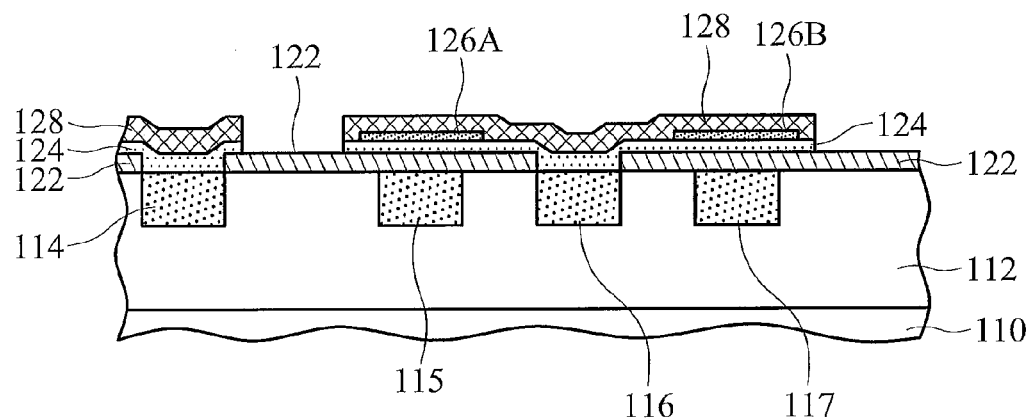

Referring next to FIG. 6, a hard mask layer 128 is next formed over the exposed surfaces of the electrode layer 124 and the magnetoresistive elements 126A and 126B. The hard mask layer 128 will serve as a stop layer for an oxide CMP process described below. The thickness of the hard mask layer 128 will ultimately define the distance between the magnetoresistive elements 126A, 126B and the upper write line 138 (discussed below, see FIG. 10). For this reason, it is desirable to use a minimal thickness for the hard mask layer 128, for instance a thickness equal to or less than approximately 1500 Å. For example, the hard mask layer 128 can be formed to have a thickness in a range of 300 Å to 1500 Å, or in a range of 550 Å to 850 Å, for example 600 Å. The hard mask 128 can be formed of any material suitable for use as an oxide CMP stop. For example, the hard mask 128 can be formed of SiN since oxide CMP processes can be used that have high selectivity "Oxide to SiN". The SiN can be deposited using a low-temperature deposition process, for example PECVD in a range of approximately 300° C. to 350° C. A low-temperature deposition process for forming the mask layer 128 will prevent damage to the magnetoresistive structure, which is sensitive to higher temperatures, for example above 400° C.

The mask layer 128 and electrode layer 124 are then patterned and etched to expose portions of the upper surface of the insulating layer 122 as shown in FIG. 6. The mask layer 128 and electrode layer 124 can be lithographically patterned, for example using photolithography, and reactive ion etched (RIE). This step allows for isolation of portions of the electrode layer 124.

Figure 7:
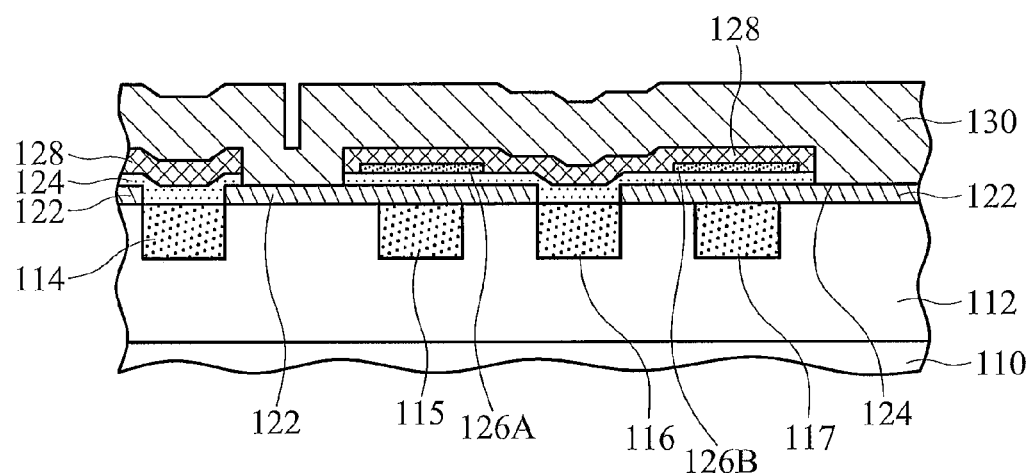

Referring next to FIG. 7, a insulating layer 130 is next formed over the exposed surfaces of the mask layer 128, the insulating layer 122, and the electrode layer 124. The insulating layer 130 can be formed of a dielectric material. For example, the insulating layer 130 can be formed of an oxide such as $SiO_2$. The $SiO_2$ can be deposited using a low-temperature deposition process, for example PECVD in a range of approximately 300° C. to 350° C. As described above with respect to formation of the mask layer 128, a low temperature deposition process for forming the insulating layer 130 will prevent damage to the magnetoresistive structure, which is sensitive to higher temperatures.

Figure 8:
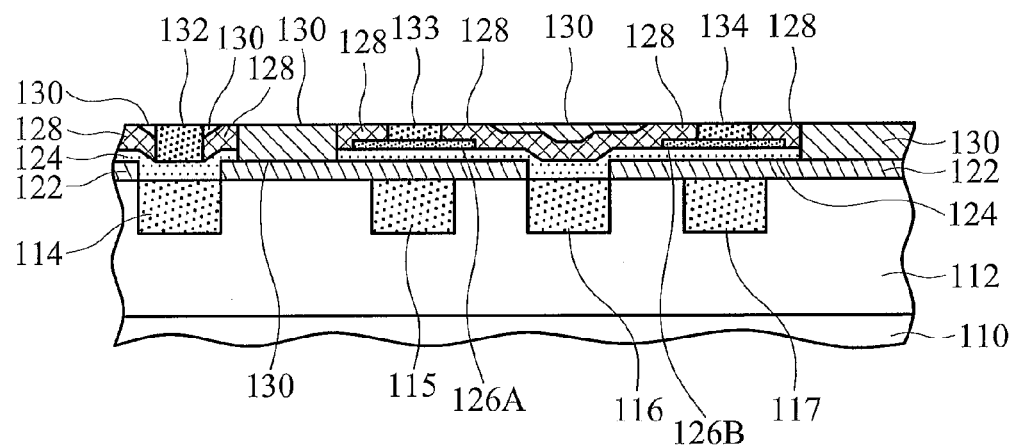

Referring next to FIG. 8, the insulating layer 130 is planarized using a CMP process having a high degree of selectivity between the material of the insulating layer 130 and the material of the hard mask layer 128 so that the hard mask layer 128 can serve as a CMP stop. For example, in some embodiments, the hard mask layer 128 is formed of SiN, the insulating layer is formed of $SiO_2$, and an oxide CMP process having a high degree of selectivity between $SiO_2$ and SiN is used to planarize the insulating layer 130, stopping flush with the upper surface of the hard mask layer 128 as shown in FIG. 8.

Next, the mask layer 128 (and in some cases remnants of the insulating layer 130) is patterned, etched, and filled with a conductive material to form conductive vias 132–134, e.g., using a damascene process. The mask layer 128 can be lithographically patterned, for example using photolithography, and reactive ion etched (RIE) to form the openings where the conductive vias 132–134 will be formed.

The conductive vias 132–134 comprise a conductive material, for example Cu, Ta, TaN, Al, TiN, Ti, W, combinations thereof, or other conductive materials. Conductive material is deposited over the exposed surfaces of the hard mask layer 128 and the insulating layer 130 and within the trenches using any deposition technique suitable for the conductive material selected. For example, in the case of copper, electrodeposition (e.g., electroplating) can be used for deposition. Any of a number of known deposition processes can be used, for example chemical vapor deposition (CVD) or physical vapor deposition (PVD) can be used for Ta or TaN. A metal CMP process may then be used for removing the excessive conductive material from above the top surface of the hard mask layer 128 and the insulating layer 130.

Figure 9:
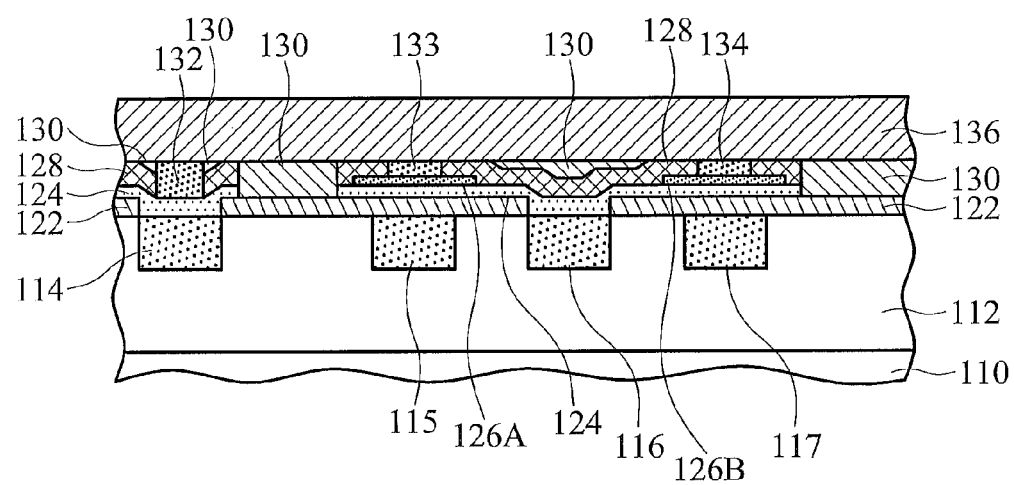

Referring next to FIG. 9, an insulating layer 136 is next formed over the exposed surfaces of the mask layer 128, the insulating layer 130, and the vias 132–134. The insulating layer 136 will serve as an electrical insulator between upper conductive lines (e.g., bit lines, etc.). Thus, the insulating layer 136 can be formed of a dielectric material. For example, the insulating layer 136 can be formed of an oxide such as $SiO_2$. The $SiO_2$ can be deposited using a low-temperature deposition process, for example PECVD in a range of approximately 300° C. to 350° C. A low-temperature deposition process for forming the insulating layer 136 will prevent damage to the magnetoresistive structure, which is sensitive to higher temperatures, for example above 400° C.

Figure 10:
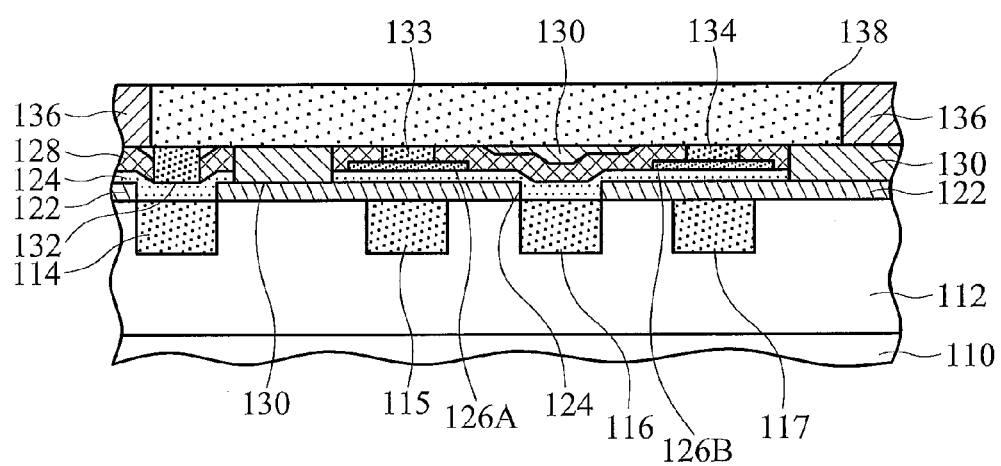

Referring next to FIG. 10, a conductive line 138 is formed in the insulating layer 136. The conductive line 138 can be formed of any conductive material. Depending on the conductive material used, the conductive line 138 can include an optional liner (not shown). For example, if copper is used for the conductive line 138, the optional liner can first be deposited to form a diffusion barrier for confining the copper. In this case, the optional liner can be formed of Ta or TaN or any other material that is a good diffusion barrier for confining copper. The conductive line 138 can be formed by etching a suitable pattern in the insulating layer 136, for example using photolithography, and depositing or plating a selected conductive material. The upper surface of the structure can then be planarized using CMP to remove excess conductive material from the upper surface of the insulating layer 136. From this point, subsequent processing can be performed to complete the manufacturing of the memory device.

It should be noted that the use of the term "layer" should not be construed to impose limitations, particularly with respect to how a "layer" is formed, for example a "layer" as referred to herein can be formed by one or multiple layer-forming steps, such as using one or more steps of deposition for forming what is termed herein as a "layer".

While various embodiments in accordance with the principles disclosed herein have been described above, it should be understood that they have been presented by way of example only, and are not limiting. Thus, the breadth and scope of the invention(s) should not be limited by any of the above-described exemplary embodiments, but should be defined only in accordance with the claims and their equivalents issuing from this disclosure. Furthermore, the above advantages and features are provided in described embodiments, but shall not limit the application of such issued claims to processes and structures accomplishing any or all of the above advantages.

Additionally, the section headings herein are provided for consistency with the suggestions under 37 CFR 1.77 or otherwise to provide organizational cues. These headings shall not limit or characterize the invention(s) set out in any claims that may issue from this disclosure. Specifically and by way of example, although the headings refer to a "Technical Field," such claims should not be limited by the language chosen under this heading to describe the so-called technical field. Further, a description of a technology in the "Background" is not to be construed as an admission that technology is prior art to any invention(s) in this disclosure. Neither is the "Brief Summary" to be considered as a characterization of the invention(s) set forth in issued claims. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings set forth herein.

What is claimed is:

1. A method of forming an interconnect between a magnetoresistive memory element of a memory cell and a conductive memory line comprising:
    forming a magnetoresistive memory element to a final width;
    forming a mask layer over and around the magnetoresistive memory element to a predetermined height over the magnetoresistive memory element;
    forming a first insulating layer over the mask layer;
    removing portions of the first insulating layer using a surface planarization process and using the mask layer as a stop, the surface planarization process reducing the first insulating layer to substantially the predetermined height thereby exposing at least a portion of the mask layer;
    forming a conductive via through the mask layer at the exposed portion(s) to contact the magnetoresistive memory element; and
    forming the conductive memory line on the conductive via.

2. A method according to claim 1, wherein the mask layer is formed of silicon nitride.

3. A method according to claim 1, wherein the first insulating layer is formed of silicon dioxide.

4. A method according to claim 1, wherein the surface planarization process comprises performing an oxide chemical mechanical polishing process for removing portions of the first insulating layer.

5. A method according to claim 4, wherein the mask layer is used as a stop for the chemical mechanical polishing process.

6. A method according to claim 5, wherein the chemical mechanical polishing process includes distinguishing between material of the first insulating layer and material of the mask layer.

7. A method according to claim 1, further comprising performing a damascene process for forming the conductive via in the mask layer.

8. A method according to claim 7, wherein the damascene process includes patterning and etching away a portion of the mask layer to expose a portion of the memory element.

9. A method according to claim 8, wherein the damascene process includes depositing a conductive material over the thus exposed portion of the memory element.

10. A method according to claim 9, wherein the damascene process includes performing a chemical mechanical polishing process for removing excess portions of the conductive material.

11. A method according to claim 1, further comprising forming a second insulating layer over the mask layer and the conductive via.

12. A method according to claim 11, further comprising performing a damascene process for forming the conductive memory line in the second insulating layer.

13. A method according to claim 1, wherein a thickness of the mask layer is set to have a thickness in an approximate range of 300 angstroms to 1500 angstroms.

14. A method according to claim 1, wherein:
the forming of the mask layer includes depositing the mask layer over the magnetoresistive memory element, wherein the mask layer is formed of silicon nitride;

the forming of the first insulating layer includes depositing the first insulating layer over the mask layer, the first insulating layer being formed of a dielectric material, the dielectric material being silicon dioxide;

the removing portions of the first insulating layer includes performing an oxide chemical mechanical polishing process as the surface planarization process for removing portions of the first insulating layer, wherein the mask layer is used as the stop for the chemical mechanical polishing process, wherein the chemical mechanical polishing process has a high degree of selectivity between the silicon dioxide of the first insulating layer and the silicon nitride of the mask layer;

the forming of the conductive via includes performing a first damascene process for forming the conductive via, the damascene process including patterning and etching away a portion of the mask layer to expose a portion of the memory element, depositing a conductive material over the thus exposed portion of the memory element, and performing a chemical mechanical polishing process to remove excess portions of the conductive material; and the forming of the conductive memory line includes forming a second insulating layer over the mask layer and the conductive via, and performing a second damascene process for forming the conductive memory line, the second damascene process including patterning and etching away a portion of the second insulating layer, the etching away including exposing a surface of the conductive via, depositing conductive material for the conductive memory line over the thus exposed surface of the conductive via, and performing a chemical mechanical polishing process for removing excess portions of the memory line conductive material.

* * * * *